US008954652B2

(12) United States Patent (10) Patent No.: US 8,954,652 B2
Haas et al. (45) Date of Patent: Feb. 10, 2015

(54) METHOD AND CONTROLLER FOR IDENTIFYING A UNIT IN A SOLID STATE MEMORY DEVICE FOR WRITING DATA TO

(75) Inventors: Robert Haas, Ossining, NY (US); Roman Pletka, Uster (CH)

(73) Assignee: International Business Machines Corporation, Armonk, NY (US)

( * ) Notice: Subject to any disclaimer, the term of this patent is extended or adjusted under 35 U.S.C. 154(b) by 143 days.

(21) Appl. No.: 13/493,255

(22) Filed: Jun. 11, 2012

(65) Prior Publication Data

US 2012/0303860 A1 Nov. 29, 2012

Related U.S. Application Data

(63) Continuation of application No. 13/480,840, filed on May 25, 2012.

(30) Foreign Application Priority Data

May 26, 2011 (EP) ..................................... 11167582

(51) Int. Cl.
*G06F 12/02* (2006.01)
*G06F 3/06* (2006.01)

(52) U.S. Cl.
CPC .... *G06F 12/0246* (2013.01); *G11C 2211/5641* (2013.01); *G06F 3/064* (2013.01); *G06F 2212/7202* (2013.01)
USPC .................................. 711/103; 711/E12.008

(58) Field of Classification Search
None
See application file for complete search history.

(56) References Cited

U.S. PATENT DOCUMENTS

| 7,120,729 | B2 * | 10/2006 | Gonzalez et al. ............. 711/103 |
| 7,340,581 | B2 * | 3/2008 | Gorobets et al. ............. 711/202 |
| 7,743,203 | B2 * | 6/2010 | France .......................... 711/103 |
| 7,949,637 | B1 * | 5/2011 | Burke ........................... 707/655 |
| 8,447,915 | B2 * | 5/2013 | Araki et al. ................... 711/103 |
| 8,537,613 | B2 * | 9/2013 | Sinclair et al. ........... 365/185.05 |
| 2007/0143561 | A1 * | 6/2007 | Gorobets ....................... 711/170 |
| 2008/0307192 | A1 * | 12/2008 | Sinclair et al. ................ 711/218 |
| 2009/0006720 | A1 * | 1/2009 | Traister ......................... 711/103 |
| 2009/0172248 | A1 * | 7/2009 | You ............................... 711/103 |
| 2009/0222616 | A1 * | 9/2009 | Yano et al. .................... 711/103 |
| 2010/0169540 | A1 * | 7/2010 | Sinclair ......................... 711/103 |
| 2010/0325351 | A1 * | 12/2010 | Bennett ......................... 711/103 |

OTHER PUBLICATIONS

The Authoritative Dictionary of IEEE Standards Terms. "Chip". Published in 2000. Updated Feb. 27, 2007. 7th ed.*

(Continued)

*Primary Examiner* — Charles Rones
*Assistant Examiner* — Hewy Li
(74) *Attorney, Agent, or Firm* — Jeff Tang; Michael J. Chang, LLC

(57) ABSTRACT

In a method for identifying a unit in a solid state memory device for writing data to a tier structure is maintained the tier structure comprising at least two tiers for assigning units available for writing data to. In response to receiving a request for writing data it is determined if a unit for writing data to is available in a first tier of the at least two tiers. In response to determining that a unit is available for writing data to in the first tier this unit is identified for writing data to, and in response to determining that no unit is available for writing the data to in the first tier it is determined if a unit is available for writing data to in a second tier of the at least two tiers subject to a priority of the write request.

16 Claims, 6 Drawing Sheets

(56) References Cited

OTHER PUBLICATIONS

The Authoritative Dictionary of IEEE Standards Terms. "Die". Published in 2000. Updated Feb. 27, 2007. 7th ed.*
Agrawal, Nitin. "Design Tradeoffs for SSD Performance". Published in 2008. USENIX 2008 Annual Technical Conference on Annual Technical Conference. P2, Paragraph 3.*
Jacob, Bruce. "Memory Systems: Cache, DRAM, Disk". Published in Jul. 2010. p. 351.*
Hu et al. "Write Amplification Analysis in Flash-Based Solid State Drives." Published in 2009.*
Shimpi, Anand Lal. "The Impact of Spare Area on SandForce, More Capacity At No Performance Loss?" Published May 3, 2010. <http://www.anandtech.com/show/3690/the-impact-of-spare-area-on-sandforce-more-capacity-at-no-performance-loss>.*
Shimpi, Anand Lal. "The SSSD Anthology: Understanding SSDs and New Drives from OCZ." Published Mar 18, 2009. <http://www.anandtech.com/show/2738/6>.*
Hu, Xiao-yu and Haas, Robert. "The Fundamental Limit of Flash Random Write Performance: Understanding, Analysis and Performance Modelling." Published Mar. 31, 2010.*

* cited by examiner

METHOD AND CONTROLLER FOR IDENTIFYING A UNIT IN A SOLID STATE MEMORY DEVICE FOR WRITING DATA TO

CROSS-REFERENCE TO RELATED APPLICATION(S)

This application is a continuation of U.S. application Ser. No. 13/480,840 filed on May 25, 2012, which claims benefit of priority of European Patent Application Number 11167582.3, filed May 26, 2011, the disclosures of which are incorporated by reference herein.

FIELD OF THE INVENTION

The present invention relates to a method and a controller for identifying a unit in a solid state memory device for writing data to. The present invention generally relates to storage systems comprising solid state memory devices such as flash based memory devices, and to techniques for efficiently providing write access to such solid state memory devices.

BACKGROUND

Solid-state memory devices, also known as solid state drives (SSD) encompass rewritable non-volatile memory devices which use electronic circuitry such as NAND Flash memories for storing data. Currently, solid-state memory devices are starting to replace conventional storage devices such as hard disk drives and optical disk drives in some arenas, such as in mass storage applications for laptops or desktops. Solid state memory devices are also investigated for replacing conventional storage devices in other areas such as in enterprise storage systems. This is because solid state memory devices offer exceptional bandwidth as well as excellent random I/O (input/output) performance along with an appreciated robustness due to lack of moveable parts.

However, writing data to flash memory devices requires paying attention to specifics in the flash technology: NAND Flash memory is organized in pages and blocks. Multiple pages form a block. While typically read and write operations can be applied to pages as a smallest unit of such operation, erase operations can only be applied to entire blocks. And while in other storage technologies outdated data can simply be overwritten by new data, flash technology requires an erase operation before new data can be written to an erased block.

For the reason that in flash technology erase operations take much longer than read or write operations, a writing technique is applied called "write out of place" in which new or updated data is written to some free page offered by a free page allocator instead of writing it to the same page where the outdated data resides. The page containing the outdated data is invalidated in this process. At some point in time, a process called "garbage collection" frees blocks for new writes by selecting a block from a set of blocks holding user data and moving to the content of all valid pages of that block to free pages in different blocks. As a result, the subject block finally comprises invalid pages only and can be erased. While this procedure requires some additional write operations in excess, it is apparent that by such approach immediate as well as frequent erase operations are avoided which would contribute to a much higher overall processing than an overhead of some additional write operations do.

In view of the above, an efficient write scheme is desired showing a good write performance.

BRIEF SUMMARY OF THE INVENTION

According to one aspect of the invention a method is provided for identifying a unit in a solid state memory device for writing data to. A tier structure is maintained having at least two tiers for assigning units available for writing data to. In response to receiving a request for writing data, determining if a unit for writing data to is available in a first tier of the at least two tiers. In response to determining that a unit is available for writing data to in the first tier, identifying this unit for writing the data to. In response to determining that no unit is available for writing data to in the first tier, determining if a unit is available for writing data to in a second tier of the at least two tiers subject to a priority of the write request.

In embodiments, the method may include one or more of the following features:
  in response to determining that no unit is available for writing data to in the first tier it is determined if a unit for writing data to is available in the second tier only if the write request is of a first priority;
  the write request is of a first priority if the write request is for relocating data stored in any one of the units of the solid state memory device;
  in response to determining that no unit is available for writing data to in the first tier the write request is blocked if the write request is of a priority lower than the first priority;
  in response to determining that a new unit is available for writing data to in the first tier the write request is unblocked;
  the write request is of a priority lower than the first priority if the write request is for writing data from a host external to the solid state memory device;
  the tier structure includes three tiers for assigning units available for writing data to;
  in response to determining that no unit is available for writing data to in the second tier, a unit available for writing the data to is identified in a third tier of the three tiers;
  units assigned to a common tier are arranged in at least one block, wherein a block is maintained in the associated tier as long as the block contains at least one unit available for writing data to, and wherein a block containing no unit available for writing data to is transferred to a pool of occupied blocks;
  in response to transferring a block from one of the tiers to the pool of occupied blocks it is determined if a free block is available, and if a free block is available a block assigned to a tier next lower than the tier from which the block is transferred to the pool of occupied blocks is transferred to such tier, the transferring of blocks from a lower to the next higher tier is repeated for all remaining lower tiers, and the free block is assigned to a lowest tier of the tier structure;
  it is determined if a free block is available from one or more of a free block pool and a block reclaiming process;
  an index is maintained for identifying a next unit for writing data to within the tiers available, wherein the next unit is a unit of the highest tier amongst the tiers containing units available for writing data to, and wherein if the next unit is the last unit available for writing data to in the associated tier the index advances to a unit available for writing data to in a next lower tier as new next unit after writing data to the next unit;
  a tier structure is maintained having at least two tiers for assigning units available for writing data for each of multiple dies of the solid state memory device, wherein an index is maintained for identifying a next unit for writing data to within the tiers available for each of the multiple dies, and wherein a die is selected out of the multiple dies for writing the data to.

According to another aspect of the present invention, a computer program product is provided having a computer readable medium having computer readable program code embodied therewith, the computer readable program code having computer readable program code configured to perform a method according to any one of the preceding embodiments.

According to a further aspect of the present invention a controller is provided for identifying a unit in a solid state memory device for writing data to, having an allocation engine adapted to execute a method according to any one of the preceding embodiments.

According to another aspect of the present invention, a storage system is provided having a controller according to the previous embodiment, and a solid state memory device.

In an embodiment, the solid state memory device of the storage system may have multiple dies for storing data, wherein at least one, and preferably more than one of the dies is assigned to a common channel.

It is understood that method steps may be executed in a different order than listed in a method claim. Such different order shall also be included in the scope of such claim as is the order of steps as presently listed.

Embodiments described in relation to the aspect of a method shall also be considered as embodiments disclosed in connection with any of the other categories such as the controller, the storage system, the computer program product, etc.

BRIEF DESCRIPTION OF THE DRAWINGS

The invention and its embodiments will be more fully appreciated by reference to the following detailed description of presently preferred but nonetheless illustrative embodiments in accordance with the present invention when taken in conjunction with the accompanying drawings.

The figures are illustrating.

DETAILED DESCRIPTION OF THE EMBODIMENTS

Figure 1:
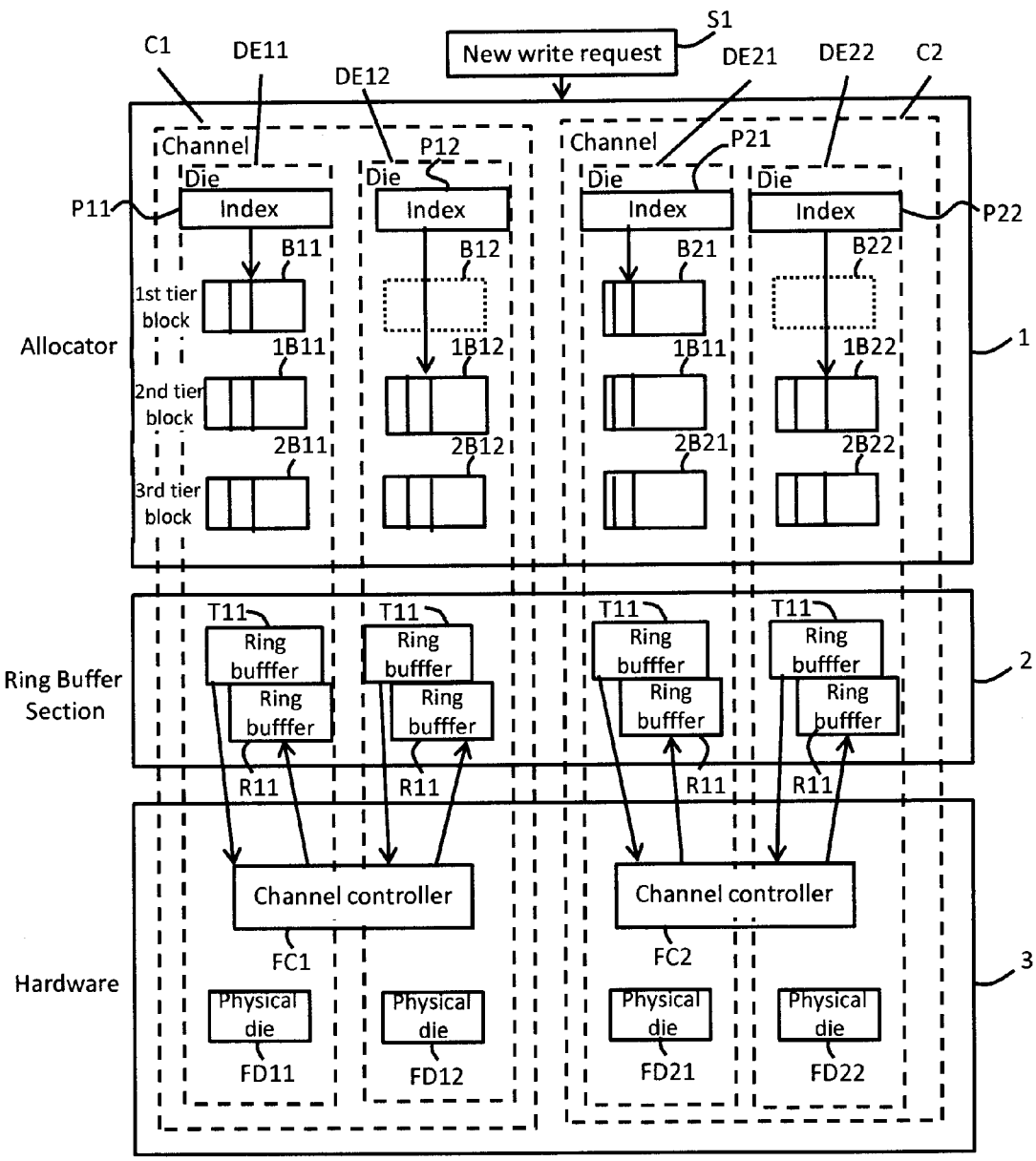
FIG. 1, a scheme of a storage system according to an embodiment of the present invention.

As an introduction to the following description, it is first pointed at a general aspect of the invention, concerning a method and a controller for identifying a unit in a solid state memory device for writing data to. The idea may refer to any solid state memory device in general. Such solid state memory devices may be characterized in that data can be stored in units. A unit may be an entity in the solid state memory device for writing data to and reading data from. Multiple of such units may form a block. A block may be defined as a set of multiple units. In some solid state memory devices, a block denotes the smallest entity for erasure operations which includes that the data of all units of a block may only be erased altogether. Specifically, in NAND Flash technology units are denoted as pages, multiple of which units form a block. In the following, it may be referred to the terminology of Flash technology although it is understood that any such disclosure shall be applicable to other solid state memory device technologies, too.

In a storage system having a solid state memory device an allocation engine may be responsible for allocating free units for writing data to. In Flash technology, such allocation engine may be a page allocator, but may also be a block allocator subject to the needs of the storage system. The allocation engine preferably may be embodied in a storage controller controlling operations on the solid state memory device. Specifically, the allocation engine may be embodied as software or firmware. The allocation engine is designed for identifying units where to write data to next.

Write requests in such storage system may originate from sources external to the storage system such as a host. On the other hand, write requests may also originate from within the storage system, and specifically from a block reclaiming process also denoted as garbage collection process in the art. Such block reclaiming process is responsible for "recycling" blocks in use which may contain a mixture of valid and invalid data, the invalid data resulting from the write out of place mechanism. Especially in a controller that is capable of processing host write requests asynchronously, host and block reclaiming write requests may compete concurrently for new write locations on the solid state memory device. It was found that it may be beneficial to prioritize block reclaiming write requests over host write requests in view of the block reclaiming process generating new memory space for subsequently writing host data to. This preference becomes apparent in a scenario in which the solid state memory device is completely occupied with valid and invalid data and no page or block is available for writing new host data to. In order to avoid a deadlock scenario it is preferred to prioritize write requests from the block/page reclaiming mechanism over write requests originating from hosts external to the storage system.

Hence, it is proposed to introduce a tier structure under control of the allocation engine wherein the tier structure includes at least two tiers for assigning units available for writing data to. The tiers of such tier structure preferably have hierarchical properties in that a first one of the tiers is followed by a second one of the tiers and so on. Pages/units available for writing data to are assigned to the tiers. In case the solid state memory device is organized into blocks with each block comprising multiple units it is preferred that entire blocks are assigned to the tiers instead of individual units. In such scenario, it is preferred that each tier may hold a single block. In a sample usage scenario, the first tier may include a block containing a multitude of units/pages most of the pages of which block are already written while only few pages are available for writing data to. A second tier may include a block with all pages available for writing data to, and so may do a third tier. Preferably, whenever a block in such tier structure is completely written, and no unit is available for writing data to any longer in that tier, such block is removed from the tier structure, and preferably is transferred to an occupied data pool. The space in such tier may need to be filled by a new block again, preferably taken from a free block pool. It is understood, that in this concept no blocks may need to be physically shifted from one memory location to another memory location. It may be control structures in the allocation engine such as an index etc. wherein the control structures implement the tier structure and assigned blocks.

In response to receiving a request for writing data it is determined if a unit for writing data to is available in a first tier of the at least two tiers. If this is the case this unit may be identified for writing the data to which results in the data being written to this unit. If this is not the case it is verified if a unit is available for writing the data to in a second tier of the at least two tiers. However, this verification may only be executed if the write request is of a defined priority, and preferably if the write request is of a first priority.

Whenever according to a preferred embodiment a write request is defined of a first priority when it originates from the block reclaiming process, or, in other words is based on a request originating from the storage system itself based on the need for relocating already stored data from one unit to another unit, it becomes apparent that the second and any lower level tiers, if present, are reserved for first, i.e., high priority write requests while it is only the first tier which serves higher and lower priority write requests. Applying this teaching to the above scenario of host write requests competing with block reclaiming requests, it is preferred that host write requests may be blocked once there are no more units available for writing data to in the first tier, while write requests internal to the storage system may be served by free units in the one or more next lower tiers.

Hence, an allocation scheme is introduced that protects block reclaiming from starving due to a high host write load. The allocation scheme ensures that valid pages touched in the block reclaiming process can always be relocated while still maintaining random write workloads from hosts and at the same time not yet requiring a complex scheduler in firmware or hardware of the storage system.

The present allocation scheme can be combined with an arbitrary block reclaiming scheme such as a cyclic buffer, greedy window, container marker scheme, or others. The allocation scheme aims at ensuring a relocation of still valid pages under a heavy host write load without intervention of a scheduler. It is independent from the way host and relocation write operations are actually scheduled, and independent from the number of channels/dies as well as independent from the block reclaiming scheme used. Note that an adequate scheduling scheme combined with the present allocation scheme can help to reduce the blocking of host write requests.

In case the solid state memory device includes multiple dies per channel and multiple channels, the present method for allocating pages may be implemented for each die, i.e., on a die basis. In a Flash memory a die is understood as an entity that can independently execute commands and typically includes a set of Flash blocks. This may ensure that page relocation requests from other channels as well as host requests can be satisfied in parallel by keeping the channels occupied. Hence, multiple channels are utilized to increase the overall write rate. Write operations to different dies attached to the same or different channels can be triggered one after the other without having to wait for the completion of the first write operation. In other words, while a data transfer to one die is ongoing, other dies can complete their write operations as they have the data to be written in local buffers. The allocation engine takes these hardware properties into account and serves free pages in a way to optimize channel utilization for write requests. The allocation engine may serve pages for host and block reclaiming write requests. It may get itself free blocks from a free block pool, or alternatively or additionally directly from the block reclaiming process. In order to balance the write work load to all available channels and dies, the allocation engine may utilize a round robin scheme that allocates pages from each channel and die in a round robin fashion in a very efficient and yet simple way. In a first round, pages are allocated from a first die in a channel for each channel. In a second round, pages are allocated from a second die from each channel and so on. In a preferred embodiment, the allocation scheme may be adapted dynamically, depending on the number of total write requests a die or channel is expected to accept until the end of life.

The present idea may be combined with other improvements for increasing the write performance of an SSD. More parallel channels may be added; the number of dies per channel may be increased; write operations may be reduced or eliminated. Besides the number of channels and the number of dies per channel, the block reclaiming rate, i.e., the rate at which the controller is able to free blocks, may be improved. The block reclaiming bandwidth is influenced by the actual block reclaiming scheme, but also by the ability to relocate still valid pages quickly. In another embodiment, a hardware of the storage system may support copyback operations, which means that valid pages can be relocated directly in one chip.

In the figures, same or similar elements are denoted by the same reference signs.

FIG. 1 illustrates a scheme of a storage system according to an embodiment of the present invention. The scheme combines hardware elements with functional and/or procedural elements. An allocator 1 cooperates with a ring buffer section 2 and an underlying hardware 3. In a vertical view, the storage system is separated into channels C1 and C2 each channel serving two die elements, DE11, DE12 and DE21, DE22 respectively, where a die element comprises one Flash die and all its associated meta-data structures. On the hardware end 3, the channels are represented by channel controllers FC1 and FC2 and the dies are represented by physical dies FD11, FD12, FD21 and FD22. A channel may serve multiple dies with data, commands, etc. in multiplexing. A die may be understood as a logical unit capable of independently executing commands for accessing the memory blocks and pages on the die.

The allocator 1 includes four allocation engines, one per die element DE11, DE12, DE21, DE22. Each page allocation engine includes a hierarchical tier structure having three tiers each, and an index pointing to the next unit in a tier available for writing data to. In the present FIG. 1, each tier may include a block the block having multiple units. The presence of a block in a tier is represented by a rectangle in straight line, the absence of a block in a tier is represented by a rectangle in a dotted line. Units/pages of a block are illustrated as stripes in a block wherein the number of units shown is only of exemplary nature. Hence, a first tier structure is assigned to the first die element DE11 having three tiers filled with blocks B11, 1B11, 2B11, and an index P11 pointing to a second unit of the block B11 in the first tier. A second tier structure is assigned to the second die element DE12 comprising three tiers only the second and the third tier of which includes blocks 1B12 and 2B12. A corresponding index P12 points at a second unit of the second block 1B12. The first tier is empty. Block B12 having resided in the first tier has been transferred to an occupied block pool. A third tier structure is assigned to the third die element DE21 having three tiers filled with a block B21, 1B21, 2B21, and an index P21 pointing to a second unit of the block B21 in the first tier. A fourth tier structure is assigned to the fourth die element DE22 having three tiers only the third tier of which is filled with block 2B22. A corresponding index P22 points at a second unit of the second block 1B22. The first tier is empty. Blocks B12 and 1B22 having resided in the first and second tier respectively have been transferred to an occupied block pool.

Symbolically, a new write request S1 is arrived. Such write request S1 may be a host write request or a block reclaiming write request caused by page relocations competing concurrently for locations on the solid state memory device, presently being embodied as a Flash memory device. The allocator 1 therefore maintains for each die in each channel a set of blocks from which pages are allocated to write requests such as 51. A first block, also denoted as "normal block" is used to allocate pages for write requests from the host and block reclaiming. Two other blocks, also denoted as the "first" and "second high priority blocks" are only used for serving write requests from the block reclaiming process. It is preferred to provide three tiers of blocks in the present example for the reason that provided all pages in a reclaimed block are valid and hence need to be relocated and provided the first and the second tier do not contain any blocks/units available for writing data to, the block in the third tier ensures sufficient space offered to a reclaimed block having all valid pages.

Hence if pages from the priority blocks need to be allocated, they are first served from the first priority block of the second tier and only when that block is empty and no longer provides pages available for writing data to, the second priority block residing in the third tier is used. The allocator 1 maintains information on the current channel and current die from which pages are allocated. It also maintains a current page index for each die which serves as the index for the next free page to be served from that die. In fact, all three blocks can share the same current page index.

Figure 2:
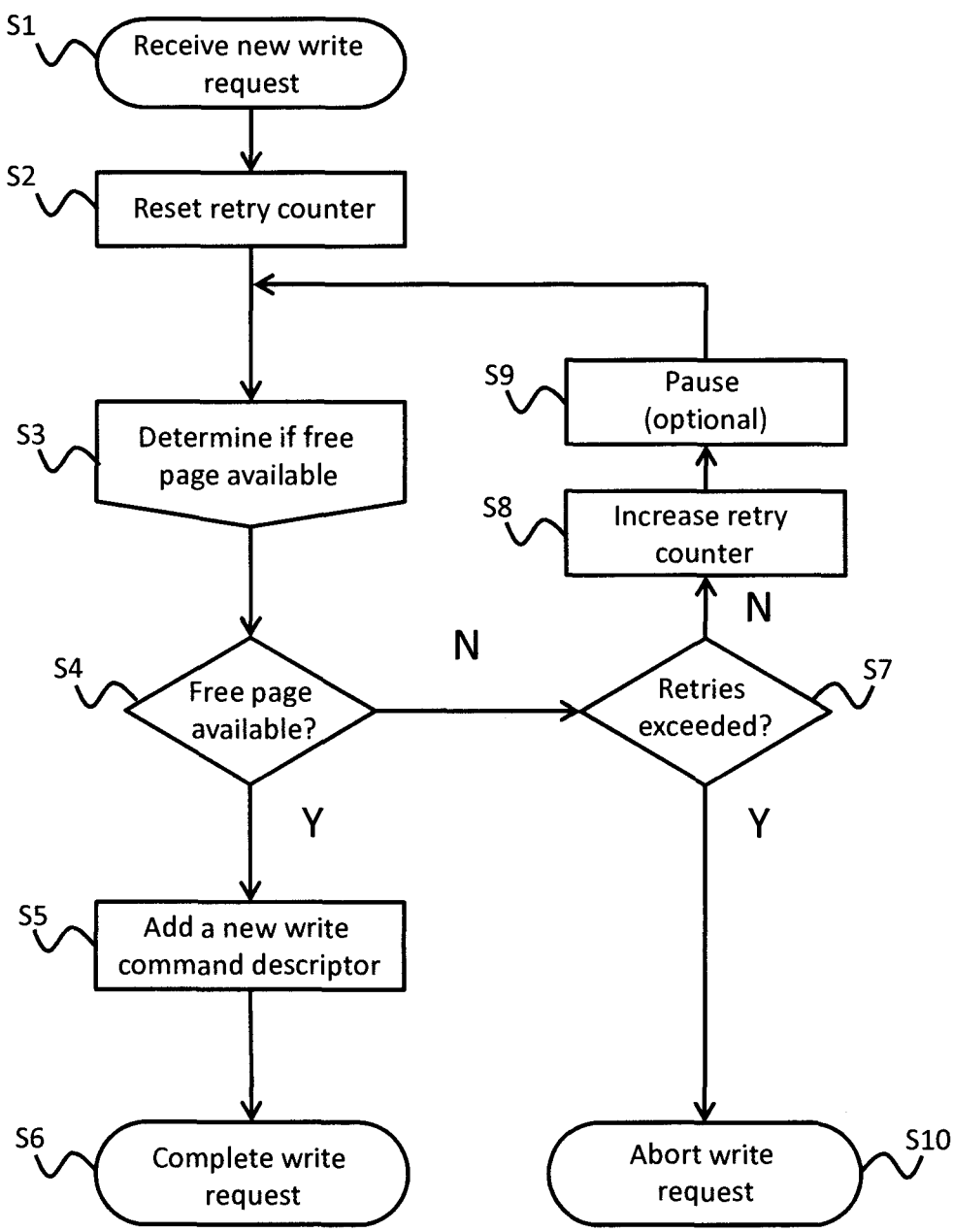
FIGS. 2 to 6 methods for identifying or contributing to identifying a unit available for writing data to in a solid state memory device according to embodiments of the present invention.

FIG. 2 illustrates a flow chart representing a method for processing a write request according to an embodiment of the present invention. The present process preferably is executed by the controller of a solid state drive, and specifically by a Flash controller responsible for operating a Flash memory device. In step S1 a new write request is received. Upon arrival of the write request in step S1, a page allocation engine of the Flash storage controller determines if a free page is available on the Flash memory device for writing data to, see in step S3. This process is described later on in more detail with respect to FIG. 3. If the page allocation engine returns an address of a page to which the data will be written in step S4 (Y), the write request processing continues by adding a new write command descriptor into a corresponding transmit ring buffer T11 of FIG. 1 in step S5. The hardware 3 of FIG. 1 will then grab the transmit command descriptor, process it by writing the data into the Flash memory device, and return a response descriptor that denotes completion of the request in step S6. A control point will then pick up the completed response descriptor, and, in case of a host write request, signal completion to the host, or in case of a block reclaiming write request inform the block reclaiming process about the completion. In case the page allocator has currently no free page to be allocated for the given priority of the request, i.e., no free page is available in the first tier structure of a normal priority write request, see step S4 (N), the process may determine if a maximum number of retries for identifying a free page is exceeded in step S7. If this is the case (Y), the write request is aborted in step S10. If a maximum number of retries is not exceeded (N), a counter for counting the number of retries is increased in step S8, an optional pause may be taken in step S9, and the page allocator may be approached again for identifying a free page in step S3. In step S2 of FIG. 2, by the way, the counter for counting the number of retries is reset.

Figure 3:
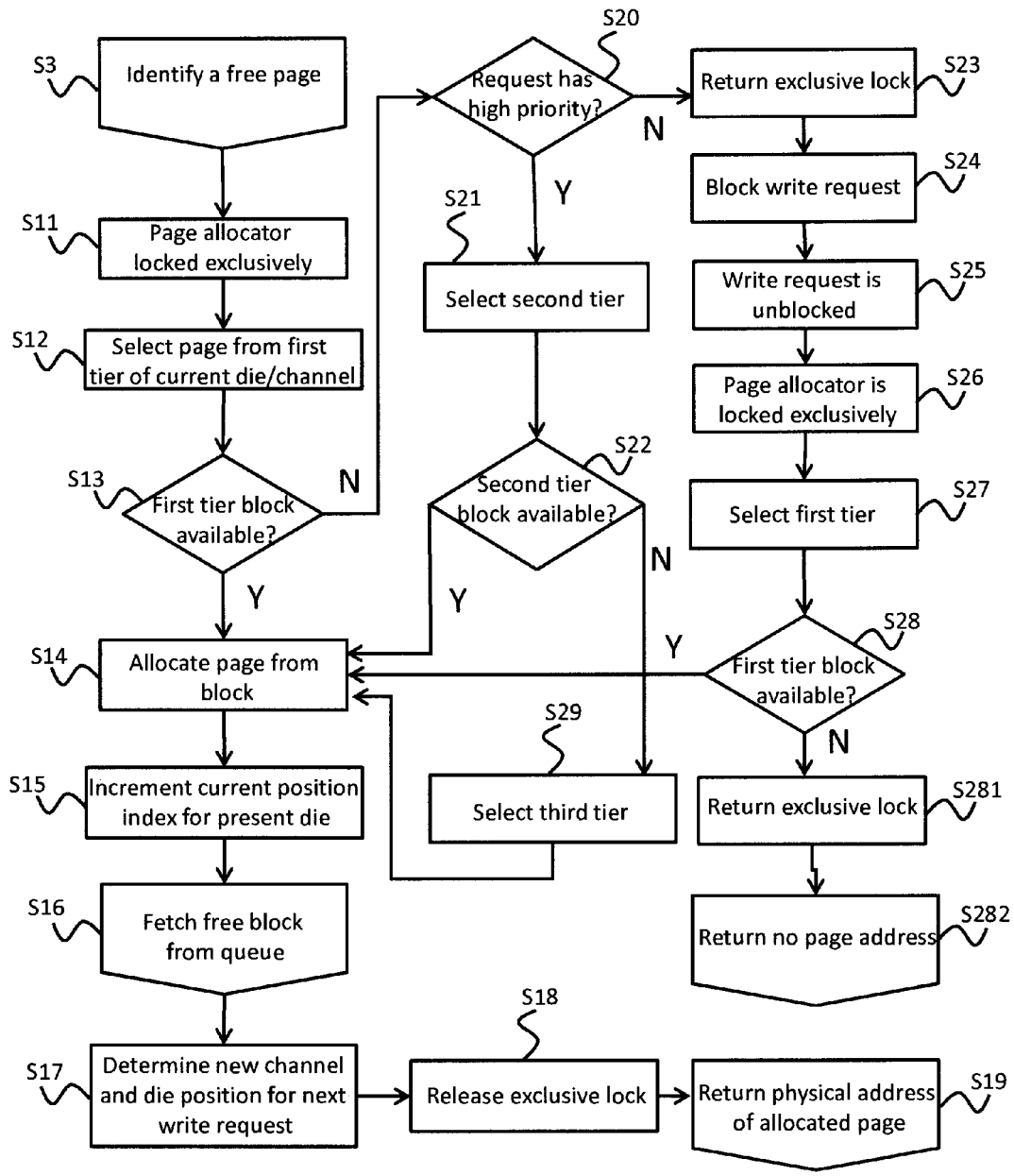

FIG. 3 shows a flow diagram illustrating an embodiment of a method of how a free page may be identified for writing the data as requested to. Insofar, the method illustrated in FIG. 3 represents step S3 of the diagram of FIG. 2 in more detail. In step S11, the page allocator is locked exclusively. This implies, that no other process, for example a process assigned to a different channel requesting for a free page, may interfere with the current process. As a result, other threads are excluded from accessing page and page allocation resources assigned to the present write request. In step S12, the method tries to select a page from the first tier of the current die on the current channel. In step S13 it is determined if a block is available on the first tier offering such page available for writing data to. If in response to such determination a page is identified from a block in the first tier (Y), this page is allocated for writing the data to in step S14. If in response to such determination no page available for writing data to is identified in the first tier (N), then it is verified if the present write request has a first priority, i.e., a high priority, in step S20. In this embodiment, write requests originating from a block reclaiming process are classified high priority whereas host write requests are classified of normal priority, i.e., a priority lower than the first priority. In case the write request is identified as a first priority write request (Y), the second tier is approached in step S21 and in step S22 it is determined if a page for writing data to is available in the second tier of the current die on the current channel. If a block exists in the second tier and as such a page is available for writing data to (Y), such page is identified for writing the data to in step S14. If there is no page available in the second tier (N), a third tier is approached in step 29 and an available page in the third tier is identified for writing the data to in step S14. Note that in an alternative implementation, it can be ensured that there is always a block available in the second tier that has free pages that can be allocated. This will be shown below in step S38. In such an implementation, steps S22 and S29 would not be needed.

In case the write request is identified of lower priority in step S20 (N), which may be interpreted that the write request is a write request originating from a host, the exclusive lock can be returned in step S23, and the write request is blocked in step S24. The write request may be unblocked later on in step S25 when enough free pages for writing the data to are available again in the first tier. Once unblocked, the exclusive lock is applied again in step S26, the first tier is selected in step S27 before it is determined in step S28 if a page is available in the first tier. In case such a page is available (Y), such page may be allocated for the write request in step S14. In case such page is not available, no free page address may be returned in step S282 after the exclusive lock has been returned in step S281.

Once a page is being allocated in step S14, a current position index for the present die is incremented in step S15. If the block in the associated tier is full now, a new free block may be fetched from a free block queue in step S16. However, it may also be possible, that currently no free block is available. In step S17, a new channel and die position is determined for allocating the next write request to. In a round-robin page allocator scheme, the current channel position may be switched to the next channel and in case the channel wraps over, the page allocator also sets the current die to the next die on the channel. Finally, in step S18 the exclusive lock is released and in step S19 the physical address of the allocated page is returned.

Figure 4:
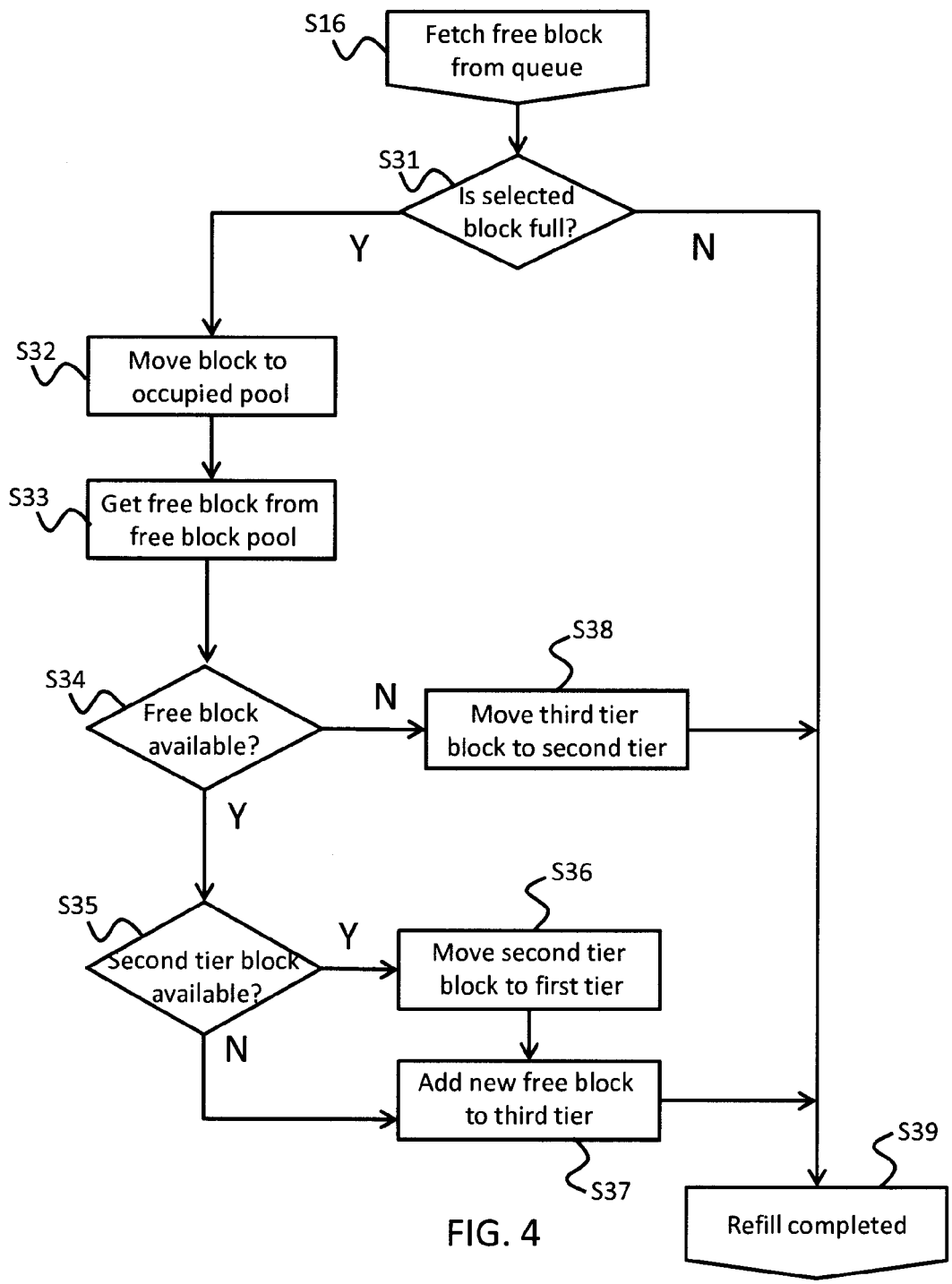

FIG. 4 illustrates in a flow diagram in more detail how the page allocator is refilled with blocks. The proposed method may be subsumed under step S16 of the diagram of FIG. 3. Once a page has been allocated from one of the tiers it is checked whether the associated block is full in step S31, i.e., it is verified if there are no free pages left in that block. If there are no free pages left in the block in that tier (Y) then the refill process begins. The full block is first moved from the page allocator to the occupied block pool, see step S32. Then the page allocator tries to get a new free block from a free block pool in step S33. If there is no free block available, see step S34 (N), then no free block can be added. In case the full block was in the second tier, the block from the third tier is moved to the second tier in step S38 and the refill process completes in step S39. Step S38 ensures that the second tier always has a block available. It may be useful from an implementation point of view as it allows looking only at the second tier in case there is no block in the first tier, instead of having to look at the third tier when first and second tier have no blocks. If a free block is available (Y), it is determined if a block is available in the second tier in step S35. If this is the case (Y), this implies in the present tier structure that there is no block in the first tier as it has just been filled up. As a result, the current second tier block is moved to the first tier in step S36, the block currently placed in the third tier becomes moved to the second tier, and the new free block is added to the third tier in step S37. Doing so actually allows to maintain one single page index per die and no separate indices need to be maintained for every block per die in the page allocator. At the same time, no block is parked for a long time in a second or third tier and overtaken by other blocks. In case there is no block in the second tier S35 (N), the block of the third tier can be used as new block in the second tier, and the new free block is added to the third tier, all in step S37.

Figure 5:
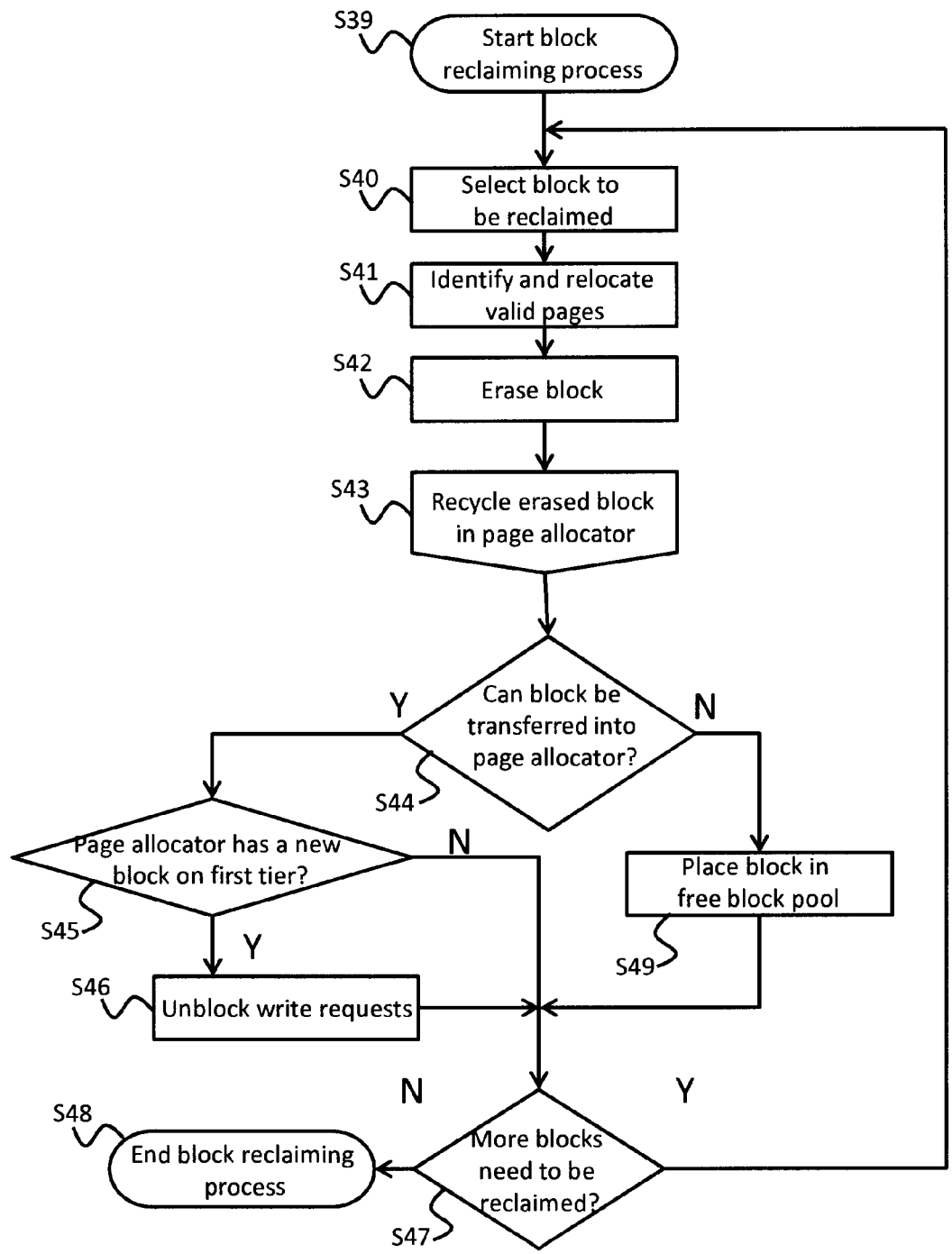

FIG. 5 illustrates a flow chart for a typical block reclaiming process according to an embodiment of the present invention. The present embodiment qualifies over conventional block reclaiming processes in that before a freshly erased block is placed into a free block pool, the present process attempts to insert the freshly erased block into the page allocator. In step S39 the block reclaiming process starts. In step S40 a block is selected to be reclaimed according to any block reclaiming mechanism applicable. In step S41 valid pages of such block to be reclaimed are identified and relocated. Step S41 is also the step in which a write request is issued to the page allocator for writing data of a still valid page elsewhere.

After having relocated the valid pages of this block, the subject block is erased in step S42. In step S43 the erased block may be recycled in the page allocation engine which is verified in step S44. If the block cannot be transferred into the page allocator (N) the block is placed in a free block pool in step S49, and in step S47 it is determined if more blocks need to be reclaimed. If this is not the case (N), the block reclaiming process terminates in step S48. If this is the case, another block may be selected for reclaiming in step S40.

However, the presently erased block may be of use if in the page allocation engine, see step S44 (Y) according to a mechanism as will be explained with respect to FIG. 6. If then the page allocation engine confirms to have a new block on the first tier in step S45 (Y), any pending blocked write request may be unblocked again in step S46. In case no block is confirmed to reside in the first tier S45 (N), the process continues with step S47.

Figure 6:
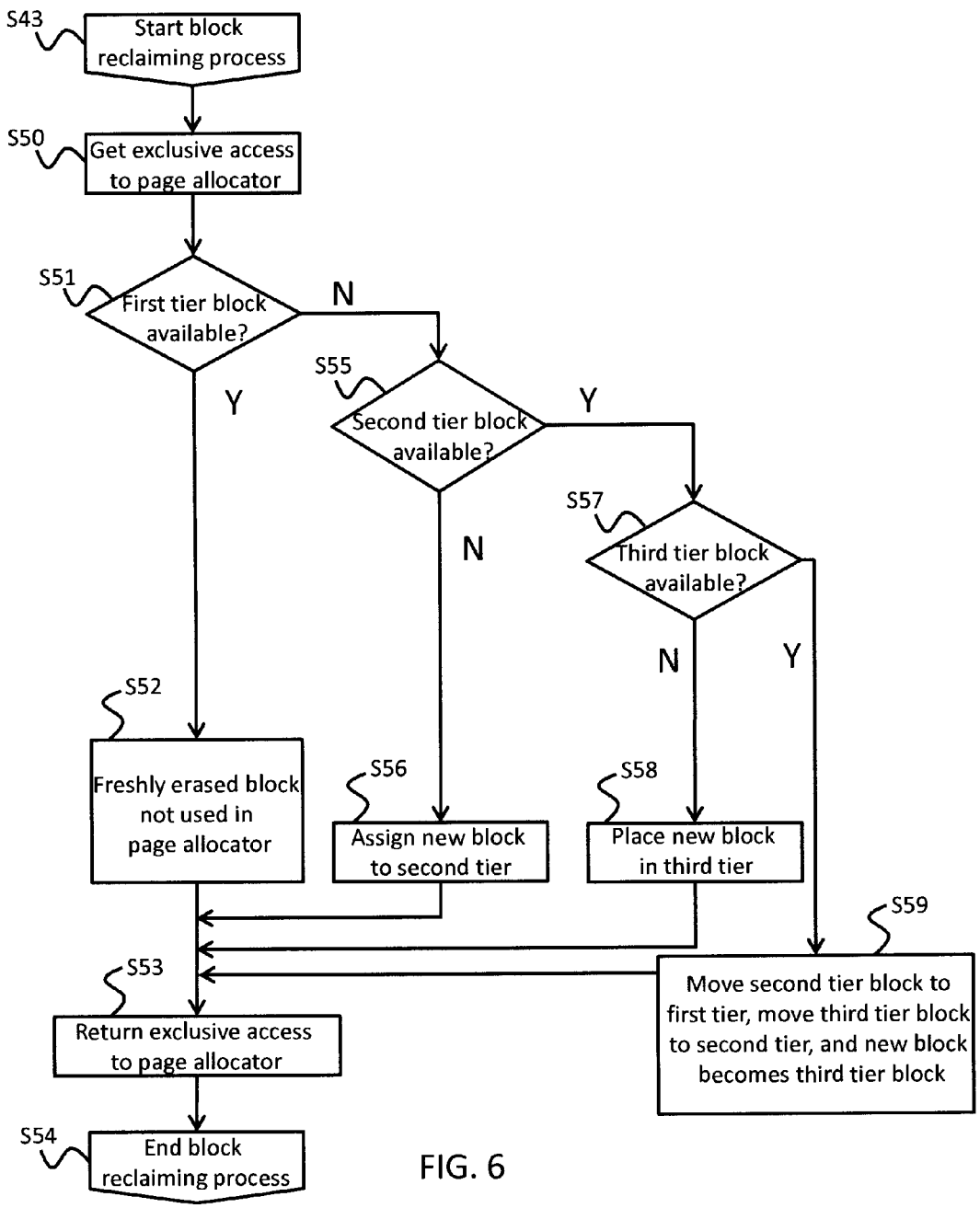

In the flow chart of FIG. 6, the direct usage of a reclaimed block in the page allocation engine is explained in more detail. In step S43, such process is started. In step S50 exclusive access is granted to the page allocation engine. In step S51 it is determined if there is a block available in the first tier. If this is the case (Y), the freshly erased block may not be used in the page allocation engine, see step S52, the exclusive access to the page allocation engine may be returned in step S53, and the process for making use of an erased block in the page allocation engine terminates in step S54.

However, if there is no block available in the first tier, see step S51 (N), it may be determined in step S55, if a block is available in the second tier. If such block is available in the second tier (Y), it is determined in step S57 if a block is available in the third tier. If this is true (Y), the block of the second tier may be moved to the first tier, the block of the third tier may be moved to the second tier, and the new block freshly erased may be used as new block in the third tier, all in step S59. If this is not true (N) in step S57, the new block may be placed in the third tier.

In case the second tier does not contain a block, see step S55 (N), this implies that there is no block in the third tier as well and the new block is assigned to the second tier.

As will be appreciated by one skilled in the art, aspects of the present invention may be embodied as a controller, method or computer program product. Accordingly, aspects of the present invention, in particular in form of the controller, may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention, such as the read and write methods, may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer, server or storage system. In the latter two scenarios, the remote computer or storage system may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer program product for identifying a unit in a solid state memory device for writing data to wherein host write requests and block reclaiming write requests compete concurrently for new write locations on the solid state memory device, the computer program product comprising a computer readable medium having computer readable program code embodied therewith, the computer readable program code comprising computer readable program code configured to perform the steps of:

maintaining a hierarchical tier structure comprising at least two tiers having blocks with units available for writing data to;

in response to receiving a write request which is either a host write request or a block reclaiming write request, and in accordance with the host write requests and the block reclaiming write requests competing concurrently for the new write locations on the solid state memory device, determining if a unit for writing data to is available in a first tier of the at least two tiers;

in response to determining that a unit is available for writing data to in the first tier, identifying this unit for writing the data to regardless of a priority of the write request;

in response to determining that no unit is available for writing data to in the first tier, determining if a unit is available for writing data to in a second tier of the at least two tiers subject to a the priority of the write request such that the second tier is used only for serving the block reclaiming write requests;

in response to writing data to a unit in a given one of the blocks in a given one of the tiers, removing the given block from the given tier when all units in the given block are occupied with data such that the blocks in the at least two tiers have units available for writing data to; and obtaining a free block to replace the given block which has been removed;

wherein the units assigned to a common tier are arranged in one of the blocks such that each of the tiers comprises only a single block, the computer readable program code further configured to perform the steps of:

maintaining a block in a tier as long as the block contains at least one unit available for writing data to, otherwise transferring the block to a pool of occupied blocks;

wherein in response to transferring a block from a given one of the tiers to the pool of occupied blocks, determining if a free block is available from one or more of a free block pool and a block reclaiming process;

if a free block is available, transferring a block assigned to a tier next lower than the given tier from which the block is transferred to the pool of occupied blocks to the given tier;

transferring blocks from a lower to a next higher tier for all remaining lower tiers; and assigning the free block to a lowest tier of the tier structure.

2. A storage system, comprising:

a solid state memory device; and a controller for identifying a unit in the solid state memory device for writing data to wherein host write requests and block reclaiming write requests compete concurrently for new write locations on the solid state memory device, the controller comprising at least one allocation engine comprising a hierarchical tier structure having at least two tiers having blocks with units available for writing data to, the allocation engine being adapted to:

in response to receiving a write request which is either a host write request or a block reclaiming write request, and in accordance with the host write requests and the block reclaiming write requests competing concurrently for the new write locations on the solid state memory device, determine if a unit for writing data to is available in a first tier of the at least two tiers;

in response to determining that a unit is available for writing data to in the first tier, identify this unit for writing the data to regardless of a priority of the write request;

in response to determining that no unit is available for writing data to in the first tier, determine if a unit is available for writing data to in a second tier of the at least two tiers subject to a the priority of the write request such that the second tier is used only for serving the block reclaiming write requests;

in response to writing data to a unit in a given one of the blocks in a given one of the tiers, removing the given block from the given tier when all units in the given block are occupied with data such that the blocks in the at least two tiers have units available for writing data to; and obtaining a free block to replace the given block which has been removed;

wherein the units assigned to a common tier are arranged in one of the blocks such that each of the tiers comprises only a single block, the allocation engine further adapted to:

maintain a block in a tier as long as the block contains at least one unit available for writing data to, otherwise transfer the block to a pool of occupied blocks;

wherein in response to transferring a block from a given one of the tiers to the pool of occupied blocks, determine if a free block is available from one or more of a free block pool and a block reclaiming process;

if a free block is available, transfer a block assigned to a tier next lower than the given tier from which the block is transferred to the pool of occupied blocks to the given tier;

transfer blocks from a lower to a next higher tier for all remaining lower tiers; and assign the free block to a lowest tier of the tier structure.

3. The storage system of claim 2, wherein the tier structure comprises three tiers having blocks with units available for writing data to.

4. The storage system of claim 2, wherein the allocation engine further has an index for identifying a next unit for writing data to within the tiers.

5. The storage system of claim 4, wherein the next unit is a unit of a highest tier amongst the tiers containing units available for writing data to.

6. The storage system of claim 2, wherein the solid state memory device comprises multiple dies for storing data, wherein at least one of the dies is assigned to a channel.

7. The storage system of claim 6, wherein the controller comprises one allocation engine for each of the dies.

8. The storage system of claim 6, wherein the channel serves more than one of the dies.

9. A method for identifying a unit in a solid state memory device for writing data to wherein host write requests and block reclaiming write requests compete concurrently for new write locations on the solid state memory device, the method comprising:

maintaining a hierarchical tier structure comprising at least two tiers having blocks with units available for writing data to;

in response to receiving a write request which is either a host write request or a block reclaiming write request, and in accordance with the host write requests and the block reclaiming write requests competing concurrently for the new write locations on the solid state memory device, determining if a unit for writing data to is available in a first tier of the at least two tiers;

in response to determining that a unit is available for writing data to in the first tier, identifying this unit for writing the data to regardless of a priority of the write request;

in response to determining that no unit is available for writing data to in the first tier, determining if a unit is available for writing data to in a second tier of the at least two tiers subject to the priority of the write request such that the second tier is used only for serving the block reclaiming write requests;

in response to writing data to a unit in a given one of the blocks in a given one of the tiers, removing the given block from the given tier when all units in the given block are occupied with data such that the blocks in the at least two tiers have units available for writing data to; and obtaining a free block to replace the given block which has been removed;

wherein the units assigned to a common tier are arranged in one of the blocks such that each of the tiers comprises only a single block, the method further comprising:

maintaining a block in a tier as long as the block contains at least one unit available for writing data to, otherwise transferring the block to a pool of occupied blocks;

wherein in response to transferring a block from a given one of the tiers to the pool of occupied blocks, determining if a free block is available from one or more of a free block pool and a block reclaiming process;

if a free block is available, transferring a block assigned to a tier next lower than the given tier from which the block is transferred to the pool of occupied blocks to the given tier;

transferring blocks from a lower to a next higher tier for all remaining lower tiers; and assigning the free block to a lowest tier of the tier structure.

10. The method of claim 9, further comprising:

wherein in response to determining that no unit is available for writing data to in the first tier, determining if a unit for writing data to is available in the second tier only if the write request is of a first priority, wherein the write request is of a first priority if the write request is for relocating data stored in any one of the units of the solid state memory device.

11. The method of claim 10, further comprising:

wherein in response to determining that no unit is available for writing data to in the first tier, blocking the write request if the write request is of a priority lower than the first priority.

12. The method of claim 11, further comprising:

wherein in response to determining that a new unit is available for writing data to in the first tier, unlocking the write request.

13. The method of claim 11, wherein the write request is of a priority lower than the first priority if the write request is for writing data from a host external to the solid state memory device.

14. The method of claim 10, wherein the tier structure comprises three tiers for assigning units available for writing data to, the method further comprising:

wherein in response to determining that no unit is available for writing data to in the second tier, identifying a unit available for writing the data to in a third tier of the three tiers.

15. The method of claim 9, further comprising:

maintaining an index for identifying a next unit for writing data to within the tiers available, wherein the next unit is a unit of a highest tier amongst the tiers containing units available for writing data to; and if the next unit is a last unit available for writing data to in the highest tier, advancing the index to a unit available for writing data to in a next lower tier as a new next unit after writing the data to the next unit.

16. The method of claim 9, further comprising:
maintaining a tier structure comprising at least two tiers for assigning units available for writing data for each of multiple dies of the solid state memory device;
maintaining an index for identifying a next unit for writing data to within the tiers available for each of the multiple dies; and
selecting a die out of the multiple dies for writing data to.

* * * * *